(12) United States Patent
Wageningen et al.

(10) Patent No.: US 7,479,803 B1
(45) Date of Patent: Jan. 20, 2009

(54) TECHNIQUES FOR DEBUGGING HARD INTELLECTUAL PROPERTY BLOCKS

(75) Inventors: Darren van Wageningen, Kanata (CA); Boon Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 516 days.

(21) Appl. No.: 10/960,302

(22) Filed: Oct. 6, 2004

(51) Int. Cl.
*G06F 7/38* (2006.01)
*H03K 19/173* (2006.01)

(52) U.S. Cl. .......................... 326/46; 327/185
(58) Field of Classification Search ............. 326/37–41, 326/47, 46; 716/16
See application file for complete search history.

(56) References Cited

U.S. PATENT DOCUMENTS

| | | | |
|---|---|---|---|
| 6,349,346 B1 * | 2/2002 | Hanrahan et al. .............. 710/9 |
| 7,080,226 B1 * | 7/2006 | Patterson .................... 711/165 |
| 7,222,314 B1 * | 5/2007 | Miller et al. .................... 716/3 |
| 2003/0051058 A1 * | 3/2003 | Phong et al. ................ 709/250 |

OTHER PUBLICATIONS

John Deatherage "Streamline Design Efforts with the New SPI4-2 Interface" Intel Developer Update Magazine (Sep. 2002, pp. 1-6) See Overview p. 3 http://www.intel.com/technology/magazine/communications/nc09023.pdf.*

* cited by examiner

*Primary Examiner*—Rexford Barnie
*Assistant Examiner*—Dylan White
(74) *Attorney, Agent, or Firm*—Townsend and Townsend and Crew LLP

(57) ABSTRACT

Techniques are provided to hardware debug a programmable logic integrated circuit that includes a hardware intellectual property block (HIP). The HIP includes a logic circuit and state machine(s). The state machine outputs state machine information depending on selected signals within the logic circuit. The HIP block can also output data from a number of internal registers/flip-flops. Optional data registering logic can capture the state machine information and output it to a data bus.

19 Claims, 5 Drawing Sheets

TECHNIQUES FOR DEBUGGING HARD INTELLECTUAL PROPERTY BLOCKS

BACKGROUND OF THE INVENTION

The present invention relates to techniques for debugging hard intellectual property blocks, and more particularly, to techniques for accessing various internal signals of a hard intellectual property block.

Programmable logic devices (PLDs) are a type of programmable logic integrated circuit. Programmable logic integrated circuits can be configured to perform a variety of logical user functions. Programmable logic integrated circuits also include field programmable gate arrays (FPGAs), programmable logic arrays, configurable logic arrays, etc.

PLDs typically have numerous logic blocks that can be configured to implement various combinatorial and sequential functions. The logic blocks have access to a programmable interconnect structure. The programmable interconnect structure can be programmed to interconnect the logic blocks in almost any desired configuration. Many of today's PLDs have on-chip non-programmable application specific integrated circuit (ASIC) blocks. The ASIC blocks are also referred to as hard intellectual property (HIP) blocks.

A HIP block embedded in PLD is very difficult to hardware debug as internal signals of the HIP block cannot be directly probed. To provide access to internal signals, one conventional technique dedicates input/output (I/O) pins of the HIP block to key internal signals. However, many of these dedicated I/O pins become unnecessary after completion of design verification. Thus, during normal operation, a significant number of the limited I/O pins of the HIP block are squandered.

Therefore, it would be desirable to provide improved techniques to debug a HIP block by monitoring internal signals and states of the HIP block.

BRIEF SUMMARY OF THE INVENTION

The present invention provides techniques for debugging a hard intellectual property (HIP) block on a programmable logic integrated circuit. These techniques allow access, direct or indirect, to internal signals of the HIP block. These signals are the outputs of internal registers or flip-flops, which include finite state machine state bits. The internal signals or state information is captured, outputted to a dedicated debug bus, and analyzed for illegal state transitions.

According to one embodiment of the present invention, the HIP block can be functionally partitioned into a receive (RX) side and a transmit (TX) side. Each side may then implement one or more state machines with selected internal signals as inputs. Also, state information for each side can be captured separately. According to another embodiment of the present invention, each side of the HIP block can output state information to its respective debug bus. In yet another embodiment of the present invention, selected HIP block signals can be captured along with state information and outputted to a debug bus.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
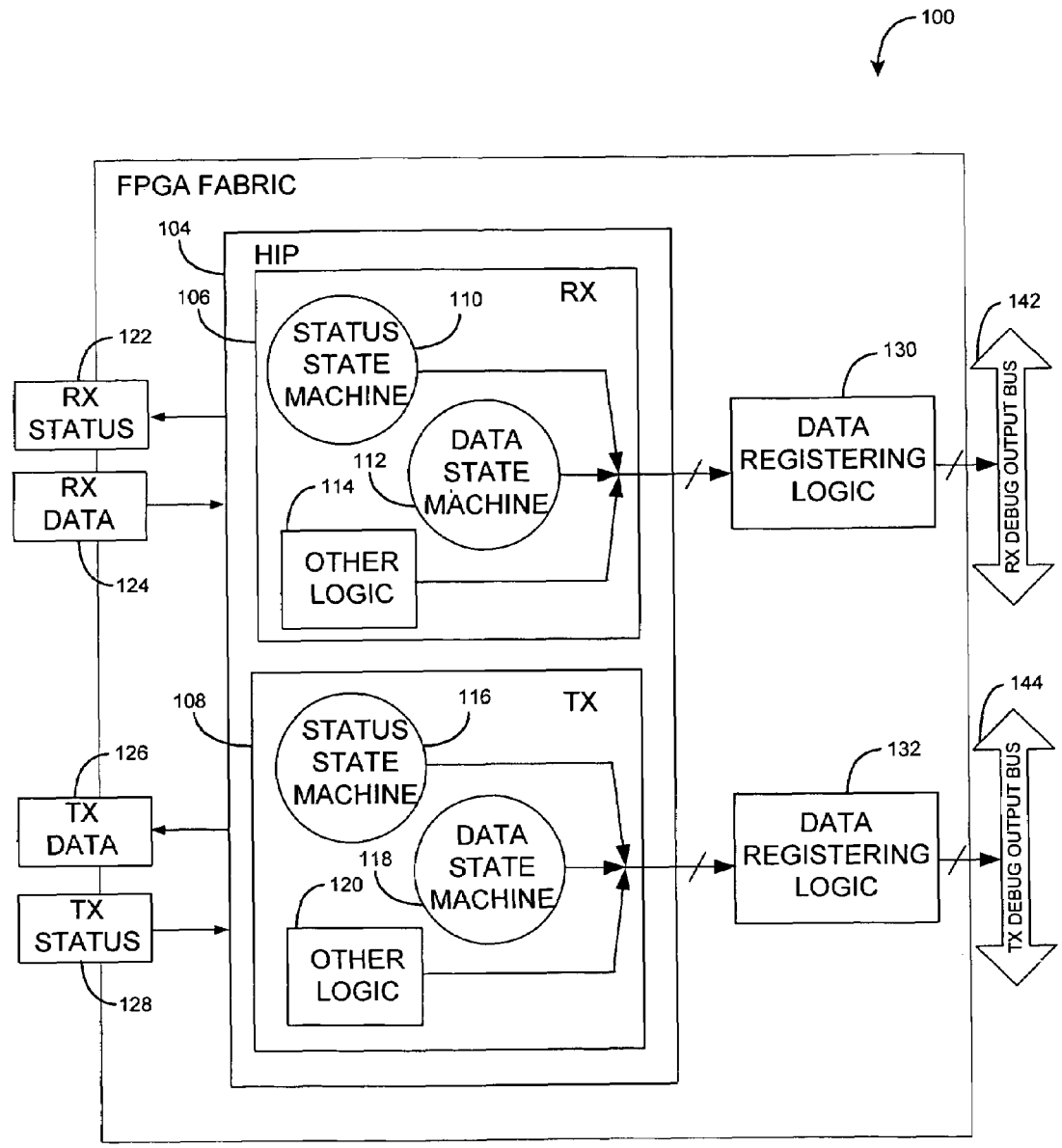
FIGS. 1A and 1B illustrate simplified block diagrams of a HIP block that provides access to internal signals, according to embodiments of the present invention.
Figure 1B:
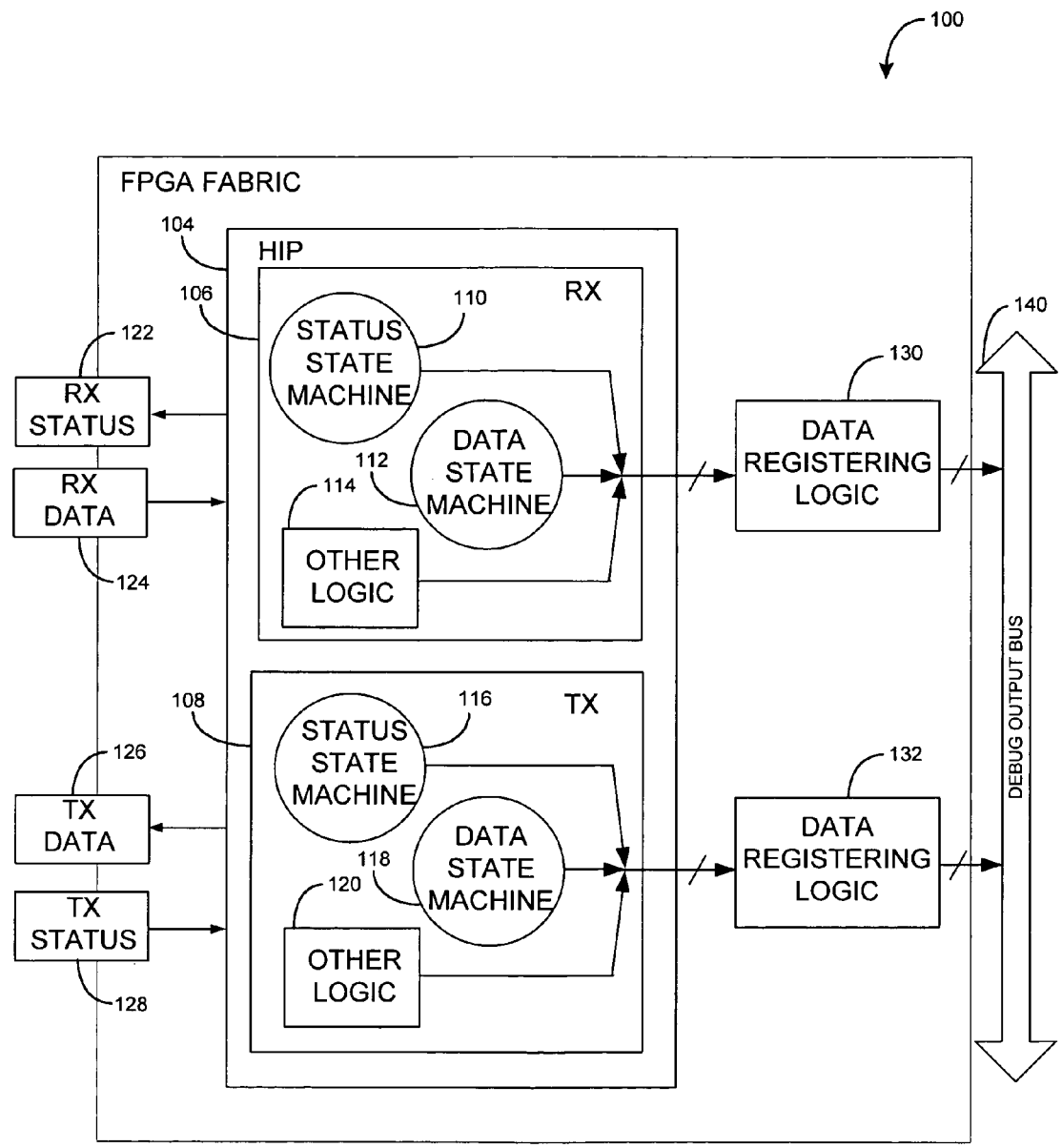

FIGS. 1A and 1B illustrate block diagrams of a programmable logic integrated circuit (IC) 100 that includes a hard intellectual property (HIP) block according to embodiments of the present invention. IC 100 is a field programmable gate array (FPGA). Although the present invention is discussed primarily in the context of programmable logic integrated circuits such as PLDs and FPGAs, it should be understood the present invention is not limited to programmable logic integrated circuits. The techniques of the present invention can also be applied to ASICs and other types of integrated circuits.

FPGA 100 includes HIP block 104 and optional data registering logic circuits 130, 132. HIP block 104 can be designed to perform any desirable functions. In a specific embodiment, HIP block 104 is configured to exchange I/O data with an external device in compliance with System Packet Interface, Level 4, Phase 2 (SPI4-2). HIP block 104 generates and receives various I/O signals, such as receive (RX) data 124, transmit (TX) status 128, RX status 122, and TX data 126. HIP block 104 can be functionally partitioned to an RX area 106 and an TX area 108, where RX area 106 performs functions for receiving SPI4.2 data from an external source and TX area 108 performs functions for transmitting SPI4.2 data to an external source.

The present invention provides techniques for debugging a HIP core by capturing internal HIP block signals (or state information derived therefrom) in data registering logic circuits. According to an embodiment of the present invention, RX area 106 and TX area 108 are each designed to include a status state machine (i.e., status state machines 110, 116) and data state machine (i.e., data state machines 112, 118). A state machine is a device that stores a status at a given time and can operate on one or more inputs to change the status and/or cause one or more outputs for any given change. State transitions in the status state machine and/or data state machine are dependent on events of particular interest to the design, such as a change in a specified internal signal or the operation of a particular function. The output of the state machine can convey the status of key internal signals and changes thereto. Based on the disclosure and teachings provided herein, a person of ordinary skill in the art will know how to select the appropriate states for a specific application.

Data state machines 112, 118 monitor signals and HIP operations relating to the processing of received or transmitted data. Status state machines 110, 116 monitor signals and HIP operations relating to transmit and receive status. However, status state machines 110, 116 and data state machines 112, 118 may be combined in any combination. For instance, state machine 110 and data state machine 112 can be combined as one state machine to provide integrated information for the RX portion of HIP block 104. Also, additional state machines may be added to HIP block 104. The number of additional state machines will be limited by the amount of I/O logic available for the debug bus.

Other logic 114 and 120 can include a variety of internal HIP flip-flops that will be of interest to the test design engineer. This logic can encompass all remaining HIP flip-flops that are not included in status state machines 110 and 116, and data state machines 112 and 118. Based on the disclosure and teachings provided herein, a person of ordinary skill in the art will know how to select the appropriate registers for a specific application.

Data registering logic circuit 130 stores state information from status state machine 110 and data state machine 112, and stores register/flip-flop information from other logic 114 for the RX portion of HIP block 104. Similarly, data registering logic circuit 132 stores state information from status state machine 116 and data state machine 118, and stores register/flip-fop information from other logic 120 for the TX portion of HIP block 104. As the status state machines 110, 116 and data state machines 112, 118 can operate at the highest clock frequency in the HIP block (i.e., state bits can be on the same clock domain as the HIP block core clock rate), data registering logic circuits 130, 132 may need operate at this clock frequency in order to capture all state transitions. According to a specific embodiment, data registering logic circuits 130, 132 can each be implemented by one or more first-in-first-out (FIFO) buffers. For example, a FIFO buffer for each the TX and RX portions of HIP block 104.

Data stored by data registering logic circuits 130, 132 can also each include information for one or more selected signals. These selected signals may not necessarily be an input for HIP block's status or data state machines. Capturing a selected signal by a data registering logic circuit may be the only, direct or indirect, way to access it.

For debugging and hardware verification of HIP block 104, captured data stored in data registering logic circuits 130, 132 are externally accessible by RX debug output bus 142 and TX debug output bus 144, respectively. In this way, a design engineer can monitor status state machines 110, 116 and data state machines 112, 118 for illegal state transitions. The occurrence of an illegal state transition indicates the existence of a design error. A design engineer can also monitor status state machines 110, 116 and data state machines 112, 118 for legal state information. A system that has locked up may be stuck in a particular state that can indicate the existence of a design error, or system mis-configuration. Captured data also can include data generated by other logic circuits 114, 120 within HIP block 104, which allows the design engineer to directly monitor a limited number of internal signals of HIP block 104. Availability of HIP I/O pins will limit the number of internal signals that can be monitored. In an alternative embodiment, as illustrated in FIG. 1B, data registering logic circuits 130, 132 can both be externally accessed via a single debug output bus 140.

As discussed above, the sequence of state transitions can be reviewed by the design engineer for illegal transitions. However, in certain applications, this process may be too cumbersome and slow. Alternatively, the sequence of state transitions can be automatically stored in a memory, such as a FIFO, and then compared to a reference sequence, which may be generated by a software simulation, by a computer. In a specific embodiment, a predetermined trigger can be used to initiate writing a sequence of state transitions to the memory. Another predetermined trigger (such as a full memory) can signal the computer to read data from the memory.

Figure 2:
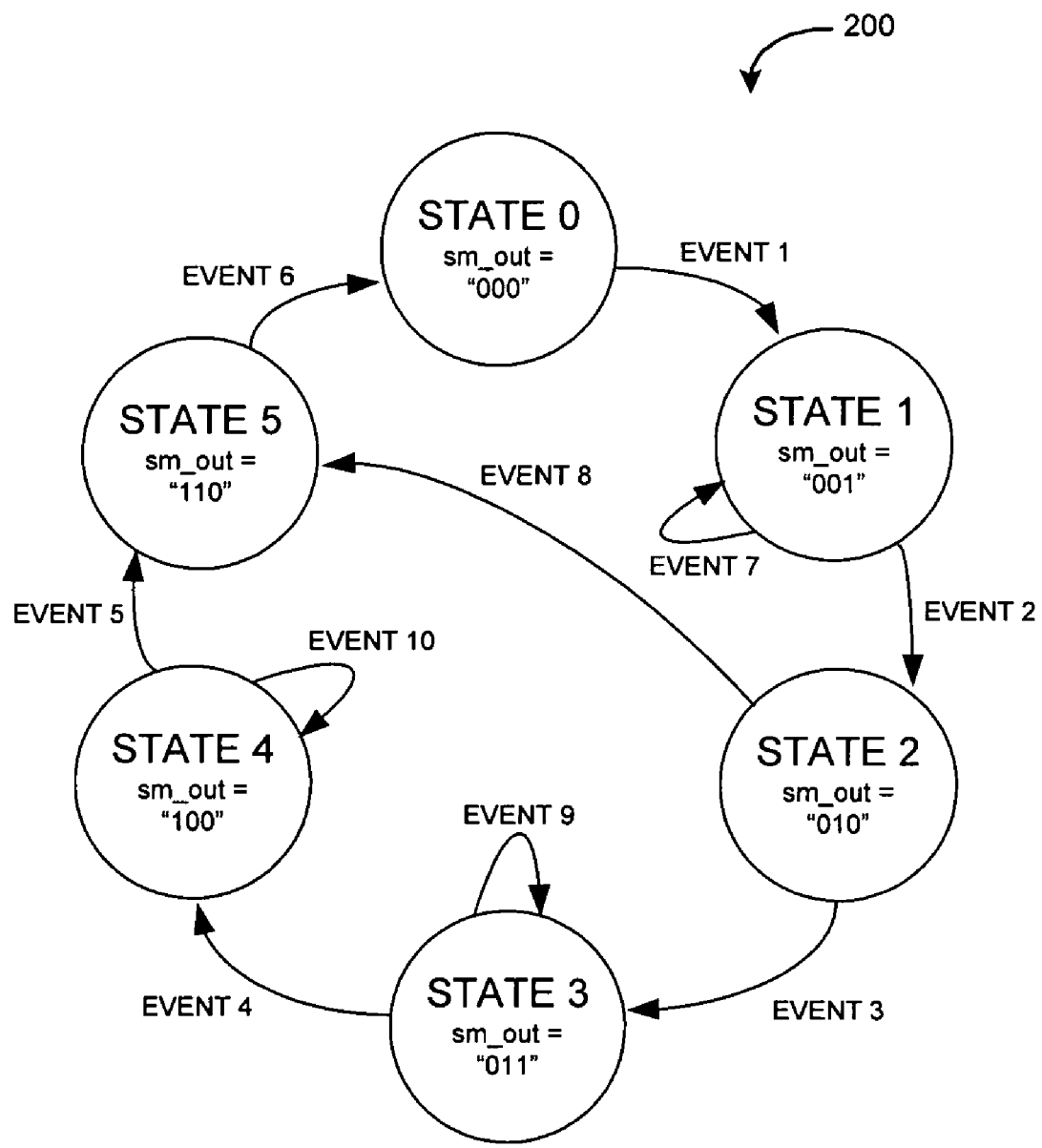
FIG. 2 illustrates a simplified example of a state machine of a HIP block, according to an embodiment of the present invention.

FIG. 2 shows a simple example of a state machine for hardware verification according to an embodiment of the present invention. State machine 200 provides a functional example of the operation of a state machine, such as the state machines 110, 112, 116, 118 shown in FIGS. 1A and 1B. In this example, state machine 200 has six states with state 0 being the default state. In other embodiments, state machine 200 may have any number of states. While in each state, state machine 200 outputs current state information as state machine output signal sm_out. The transition function for state machine 200 maps input signals and current states to a next state.

In the example shown in FIG. 2, when state machine 200 is in state 2, it may transition to state 3 or state 5 depending on the occurrence of event 3 or event 8, respectively. If however state machine 200 transitions to another state, such as state 1, the design engineer can deduce that a design error exists. Moreover, the design engineer may be provided with useful information for debugging, such as the state information immediately before and after the illegal state transition. An alternative, exemplary case is when state machine 200 is in state 3 and indefinitely remains in state 3. The design engineer can then deduce that event 9 is continually occurring, which may lead to the discovery of a mis-configuration of the HIP block, or user error (such as an input signal tied high in error).

Figure 3:
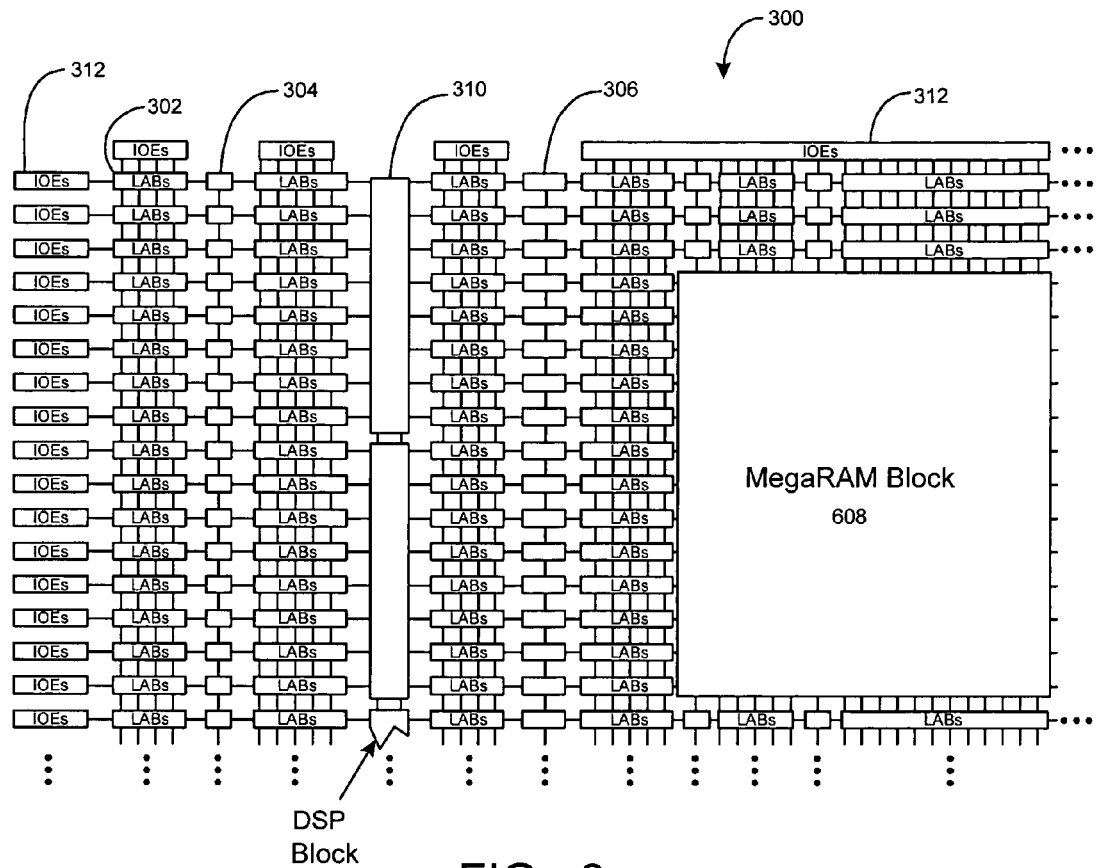
FIG. 3 is a simplified block diagram of a programmable logic device that can be used with the techniques of the present invention.

FIG. 3 is a simplified partial block diagram of one example of PLD 300 that can include aspects of the present invention. Although the present invention is discussed primarily in the context of PLDs and FPGAs, it should be understood that the present invention can be applied to numerous types of programmable integrated circuits. PLD 300 is an example of a programmable integrated circuit in which techniques of the present invention can be implemented. PLD 300 includes a two-dimensional array of programmable logic array blocks (or LABs) 302 that are interconnected by a network of column and row interconnects of varying length and speed. LABs 302 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 300 also includes a distributed memory structure including RAM blocks of varying sizes provided throughout the array. The RAM blocks include, for example, 512 bit blocks 304, 4K blocks 306 and a MegaBlock 308 providing 512K bits of RAM. These memory blocks can also include shift registers and FIFO buffers.

PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented in many different types of PLDs, FPGAs, and the like.

Figure 4:
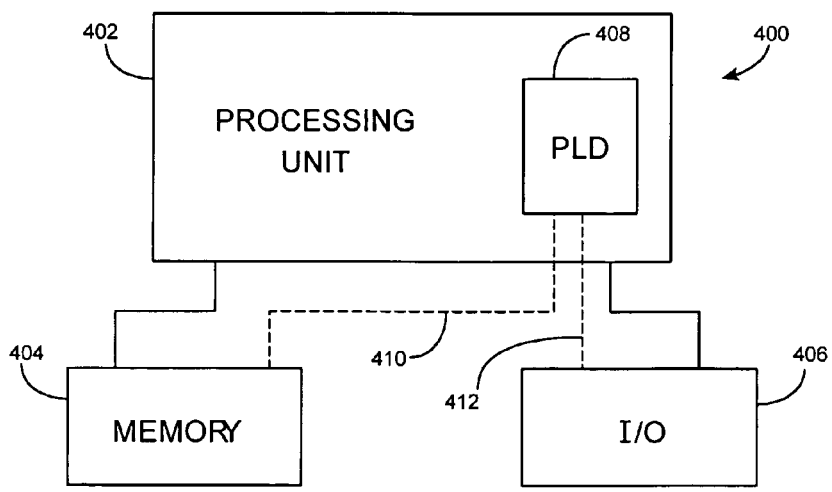
FIG. 4 is a block diagram of an electronic system that can implement embodiments of the present invention.

While PLDs of the type shown in FIG. 3 provide many of the resources required to implement system level solutions, the present invention can also benefit systems wherein a PLD is one of several components. FIG. 4 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, a programmable logic device (PLD) 408 is embedded in processing unit 402. PLD 408 can serve many different purposes within the system in FIG. 4. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

Figure 5:
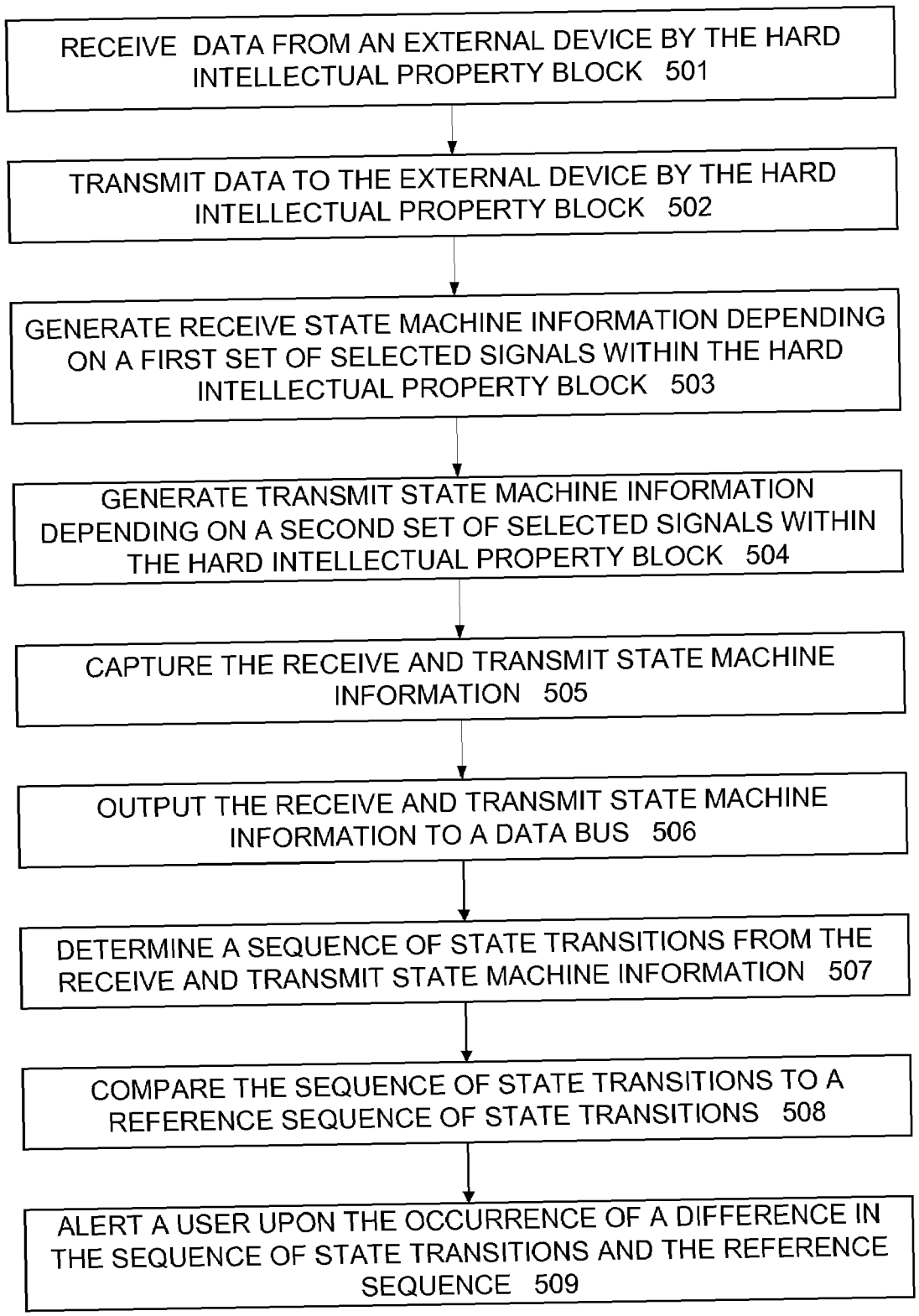
FIG. 5 illustrates a method for locating a hardware design error or user mis-configuration in a hard intellectual property block of a programmable logic integrated circuit.

FIG. 5 illustrates a method for locating a hardware design error or user mis-configuration in a hard intellectual property block of a programmable logic integrated circuit. In act 501, data is received from an external device by the hard intellectual property block. In act 502, data is transmitted to the external device by the hard intellectual property block. In act 503, receive state machine information depending on a first set of selected signals within the hard intellectual property block is generated. In act 504, transmit state machine information depending on a second set of selected signals within the hard intellectual property block is generated. In act 505, receive and transmit state machine information is captured. In act 506, receive and transmit state machine information is output to a data bus. In act 507, a sequence of state transitions from the receive and transmit state machine information is determined. In act 508, the sequence of state transitions is compared to a reference sequence of state transitions. In act 509, a user is alerted upon the occurrence of a difference in the sequence of state transitions and the reference sequence.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit comprising a hard intellectual property block, the hard intellectual property block comprising:
    a first logic circuit configured to receive data from an external device;
    a second logic circuit configured to transmit data to the external device;
    a first state machine configured to output first state machine information depending on selected signals within the first logic circuit;
    a second state machine configured to output second state machine information depending on selected signals within the second logic circuit;
    first data registering logic configured to capture the first state machine information, the first data registering logic coupled to at least one data bus, and
    second data registering logic configured to capture the second state machine information, the second data registering logic coupled to the at least one data bus,
    wherein the at least one data bus couples with an interface of the programmable logic integrated circuit, and wherein the at least one data bus comprises:
        a first data bus dedicated to output first state machine information; and
        a second data bus dedicated to output second state machine information.

2. The programmable logic integrated circuit defined in claim 1 wherein the first data registering logic comprises at least one FIFO memory device.

3. The programmable logic integrated circuit defined in claim 1 wherein a rate that the first data bus provides the first state machine information is a frequency of the hard intellectual property block that the first state machine is clocked on.

4. The programmable logic integrated circuit defined in claim 3 wherein a rate that the second data bus provides the second state machine information is a frequency of the hard intellectual property block that the second state machine is clocked on.

5. The programmable logic integrated circuit defined in claim 1 wherein the first data bus is dedicated exclusively for a receive side of the hard intellectual property block and the second data bus is dedicated exclusively for a transmit side of the hard intellectual property block.

6. The programmable logic integrated circuit defined in claim 1 wherein the hard intellectual property block is configured to exchange data with the external device with a "System Packet Interface Level 4 Phase 2: OC-192 System Interface for Physical and Link Layer Devices" protocol.

7. The programmable logic integrated circuit defined in claim 1 wherein the first data registering logic is further configured to capture information for at least one specified signal.

8. The programmable logic integrated circuit defined in claim 7 wherein the first and second state machine information are independent of the specified signal.

9. The programmable logic integrated circuit defined in claim 7 wherein the specified signal is inaccessible at an input/output pin of the hardware intellectual property.

10. A method for locating a hardware design error or user mis-configuration in a hard intellectual property block of a programmable logic integrated circuit, the method comprising:
- receiving data from an external device by the hard intellectual property block;
- transmitting data to the external device by the hard intellectual property block;
- generating receive state machine information depending on a first set of selected signals within the hard intellectual property block;
- generating transmit state machine information depending on a second set of selected signals within the hard intellectual property block;
- capturing the receive and transmit state machine information;
- outputting the receive and transmit state machine information to a data bus; and determining a sequence of state transitions from the receive and transmit state machine information; and

- comparing the sequence of state transitions to a reference sequence of state transitions,
- wherein the data bus is accessible at an interface of the programmable logic integrated circuit, and
- wherein a software simulation generates the reference sequence.

11. The method of claim 10 wherein the receiving and transmitting complies with a "System Packet Interface Level 4 Phase 2: OC-192 System Interface for Physical and Link Layer Devices" protocol.

12. The method of claim 10 further comprising capturing information of a specified signal.

13. The method of claim 12 wherein the sequence of state transitions from the receive and transmit state machine information is independent of the specified signal.

14. The method of claim 12 wherein the specified signal is inaccessible at an input/output pin of the hardware intellectual property.

15. A method for locating a hardware design error or user mis-configuration in a hard intellectual property block of a programmable logic integrated circuit, the method comprising:
- receiving data from an external device by the hard intellectual property block;
- transmitting data to the external device by the hard intellectual property block;
- generating receive state machine information depending on a first set of selected signals within the hard intellectual property block;
- generating transmit state machine information depending on a second set of selected signals within the hard intellectual property block;
- capturing the receive and transmit state machine information;
- outputting the receive and transmit state machine information to a data bus; and
- determining a sequence of state transitions from the receive and transmit state machine information;
- comparing the sequence of state transitions to a reference sequence of state transitions; and
- alerting a user upon the occurrence of a difference in the sequence of state transitions and the reference sequence,
- wherein the data bus is accessible at an interface of the programmable logic integrated circuit.

16. The method of claim 15 wherein the receiving and transmitting complies with a "System Packet Interface Level 4 Phase 2: OC-192 System Interface for Physical and Link Layer Devices" protocol.

17. The method of claim 15 further comprising capturing information of a specified signal.

18. The method of claim 17 wherein the sequence of state transitions from the receive and transmit state machine information is independent of the specified signal.

19. The method of claim 17 wherein the specified signal is inaccessible at an input/output pin of the hardware intellectual property.

* * * * *